United States Patent
Liu et al.

(10) Patent No.: US 7,767,955 B2
(45) Date of Patent: Aug. 3, 2010

(54) IMAGE DETECTING APPARATUS HAVING AN ILLUMINATION SYSTEM AND A SENSING SYSTEM

(75) Inventors: Tien-Chia Liu, Hsinchu (TW); Hung-Ching Lai, Hsinchu (TW); Hui-Hsuan Chen, Hsinchu (TW)

(73) Assignee: PixArt Imaging Inc., Hsinchu (TW)

( * ) Notice: Subject to any disclaimer, the term of this patent is extended or adjusted under 35 U.S.C. 154(b) by 0 days.

(21) Appl. No.: 12/169,651

(22) Filed: Jul. 9, 2008

(65) Prior Publication Data

US 2009/0250642 A1     Oct. 8, 2009

(30) Foreign Application Priority Data

Apr. 8, 2008    (TW) .............................. 97112720 A

(51) Int. Cl.
*G01P 3/36* (2006.01)
(52) U.S. Cl. ...................................... 250/221; 359/28
(58) Field of Classification Search ................. 250/221; 345/163; 356/28, 615
See application file for complete search history.

(56) References Cited

U.S. PATENT DOCUMENTS

| 6,674,517 B2 * | 1/2004 | Yamaguchi et al. ........... 356/28 |
| 2008/0156967 A1 * | 7/2008 | Oh et al. ..................... 250/221 |

* cited by examiner

*Primary Examiner*—Georgia Y Epps
*Assistant Examiner*—Tony Ko
(74) *Attorney, Agent, or Firm*—Chun-Ming Shih

(57) ABSTRACT

An image detecting apparatus includes an illumination system and a sensing system. The illumination system is for providing a light beam to a working surface to generate a reflected light beam by the working surface. The sensing system includes a sensing unit and a condensing unit. The sensing unit is disposed on a transmission path of the reflected light beam reflected by the working surface for receiving the reflected light beam. The condensing unit is disposed between the sensing unit and the working surface, wherein an optical axis of the condensing unit is deviated from a main optical axis of the reflected light beam.

7 Claims, 4 Drawing Sheets

IMAGE DETECTING APPARATUS HAVING AN ILLUMINATION SYSTEM AND A SENSING SYSTEM

BACKGROUND

1. Field of the Invention

The present invention relates to an image detecting apparatus, and more particularly, relates to an image detecting apparatus for good imaging quality.

2. Description of the Prior Art

FIG. 1 is schematic view of a conventional image detecting apparatus, and FIG. 2 is a schematic view of a light beam in a sensing system of the conventional image detecting apparatus. Referring to FIGS. 1 and 2, the conventional image detecting apparatus 100 comprises an illumination system 110 and a sensing system 120. The illumination system 110 comprises a light source 112 and a lens 114, wherein the light source 112 is for providing a light beam 113, and the lens 114 is disposed on a transmission path of the light beam 113 for focusing the light beam 113 on a working surface 50. The light beam 113 has an optical axis 113a, and in FIG. 1, the optical axis 113a is represented the light beam 113. The sensing system 120 comprises a sensing unit 122 and a lens 124. The sensing unit 122 and the lens 124 are disposed on the transmission path of the light beam 113 reflected by the working surface 50, and the lens 124 is disposed between the sensing unit 122 and the working surface 50 for focusing the light beam 113 on the sensing unit 122.

In the conventional sensing system 120, the optical axis 124b of the lens 124 overlaps the optical axis 113a of the light beam 113. The lens 124 is for focusing the light beam 113 on the sensing unit 122. However, in the conventional technique, optical path differences of light rays of the light beam 113 between the working surface 50 and the sensing unit 122 are obviously different. Take main light rays (i.e. light rays with high intensity) 113b, 113c as an example, the transmission path of the light ray 113c is obviously longer than that of the light ray 113b, and thus the imaging quality is reduced.

FIG. 3 shows simulated transmission paths, simulated by an optical simulation software, of light rays of the light beam 113 in the conventional sensing system 120. Referring to FIG. 3, in the conventional sensing system 120, the light beam 113 can not be exactly focused on the sensing unit 122. Therefore, a distortion is occurred and the imaging quality is consequentially reduced.

BRIEF SUMMARY

The present invention relates to an image detecting apparatus to improve the imaging quality.

In order to achieve the above-mentioned advantage, an image detecting apparatus in accordance with the present invention is provided. The image detecting apparatus comprises an illumination system and a sensing system. The illumination system is for providing a light beam to a working surface to generate a reflected light beam by the working surface. The sensing system comprises a sensing unit and a condensing unit. The sensing unit is disposed on a transmission path of the reflected light beam reflected by the working surface for receiving the reflected light beam. The condensing unit is disposed between the sensing unit and the working surface, wherein an optical axis of the condensing unit is deviated from a main optical axis of the reflected light beam.

In one embodiment of the present invention, the optical axis of the condensing unit is substantially parallel to the main optical axis of the reflected light beam.

In one embodiment of the present invention, the condensing unit comprises a lens.

In one embodiment of the present invention, the illumination system comprises a light source for providing the light beam.

In one embodiment of the present invention, the light source comprises a light emitting diode (LED) or a laser diode (LD).

In one embodiment of the present invention, the image detecting apparatus further comprises a circuit board, wherein the light source and the sensing unit are disposed on the circuit board.

In one embodiment of the present invention, the sensing unit comprises a complementary metal-oxide-semiconductor (CMOS) image sensor or a charge coupled device (CCD).

In one embodiment of the present invention, the image detecting apparatus is an optical mouse or a fingerprint identifying apparatus.

In the present invention, the optical axis of the condensing unit is deviated from the main optical axis of the reflected light beam to reduce the optical path difference of light rays of the reflected light beam, and thus the image detecting apparatus of the present invention has better imaging quality.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
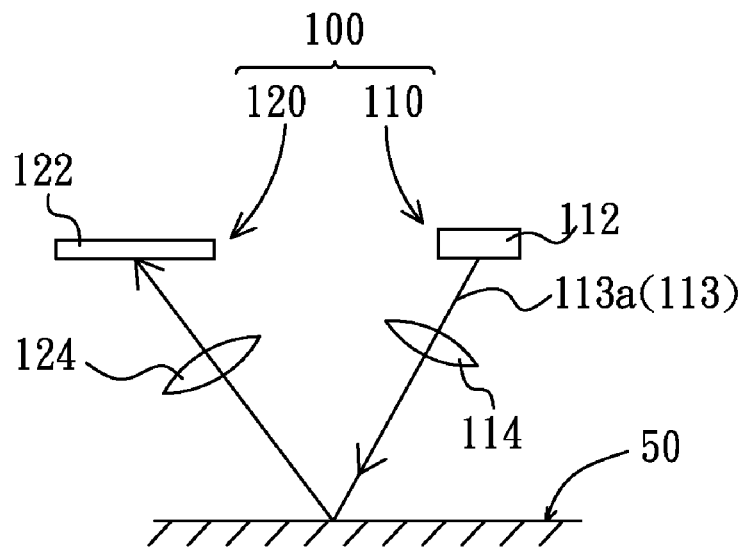
FIG. 1 is schematic view of a conventional image detecting apparatus.
Figure 2:
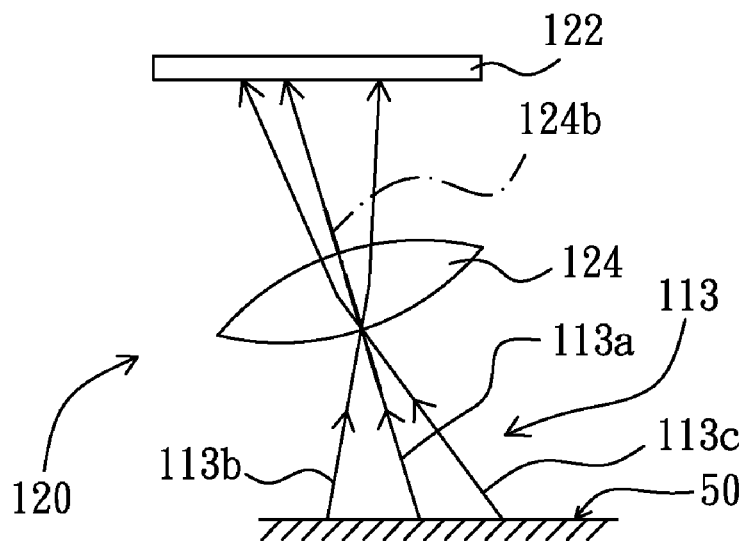
FIG. 2 is a schematic view of a light beam in a sensing system of the conventional image detecting apparatus.
Figure 3:
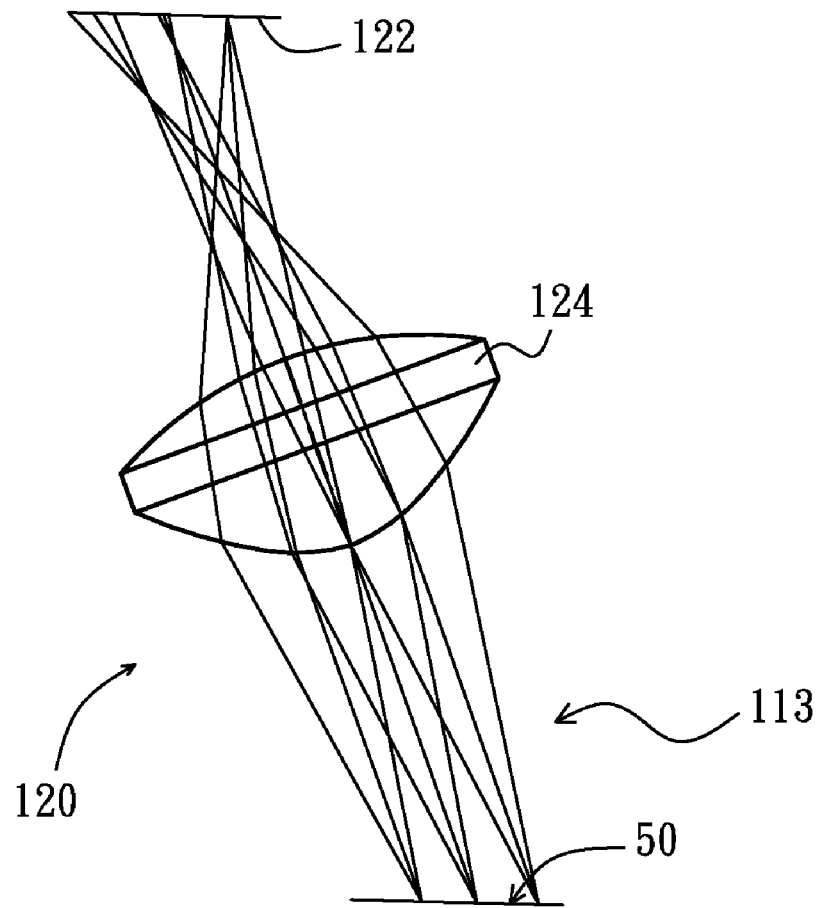
FIG. 3 is a simulate diagram showing transmission paths of light rays of the light beam in the conventional sensing system.
Figure 4:
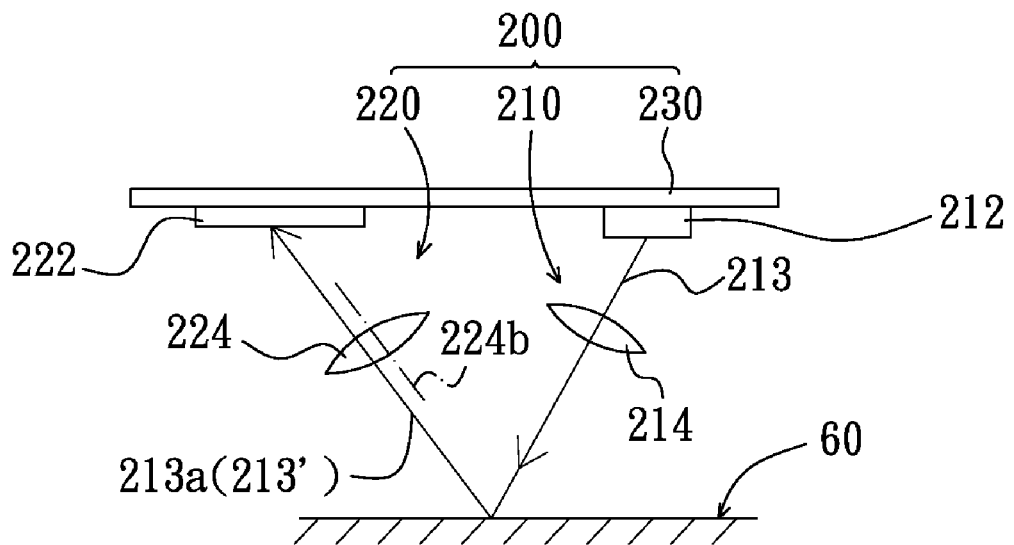
FIG. 4 is a schematic view of an image detecting apparatus according to an embodiment of the present invention.
Figure 5:
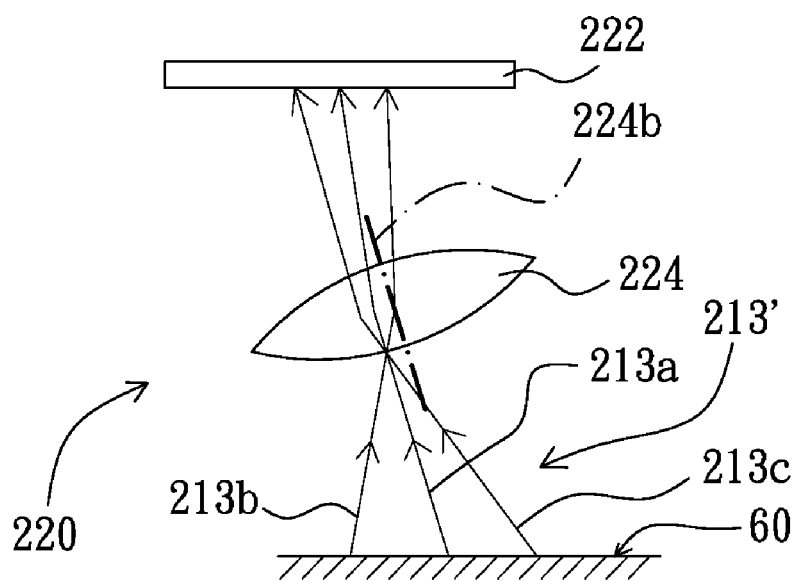
FIG. 5 is a schematic view of a light beam in a sensing system of the image detecting apparatus.

FIG. 4 is a schematic view of an image detecting apparatus according to an embodiment of the present invention, and FIG. 5 is a schematic view of a light beam in a sensing system of the image detecting apparatus. Referring to FIGS. 4 and 5, the image detecting apparatus 200 of the present embodiment can be, but not limited to, an optical mouse or a fingerprint identifying apparatus. The image detecting apparatus 200 comprises an illumination system 210 and a sensing system 220. The illumination system 210 is for providing a light beam 213 to a working surface 60 to generate a reflected light beam 213' by the working surface 60. In other words, the reflected light beam 213' means the light beam 213 after being reflected by the working surface 60. The reflected light beam 213' has a main optical axis 213a, and the main optical axis 213a is represented to the reflected light beam 213' in the FIG. 4. The sensing system 220 comprises a sensing unit 222 and a condensing unit 224. The sensing unit 222 and the condensing unit 224 are disposed on the transmission path of the reflected light beam 213', and the condensing unit 224 is disposed between the sensing unit 222 and the working surface 60. An optical axis 224b of the condensing unit 224 is deviated from the main optical axis 213a of the reflected light beam 213'.

In the image detecting apparatus 200, the illumination system 210 comprises a light source 212 and a condensing unit 214, for example. The light source 212 can be an LED or an LD, and the light source 212 is for providing the light beam 213. The condensing unit 214 can be a lens or a group of lenses. The sensing unit 222 can be a CMOS image sensor or a CCD image sensor. The condensing unit 224 of the sensing system 220 can be a lens or comprise a plurality of lenses. Moreover, the image detecting apparatus 200 may further comprise a circuit board 230, wherein the light source 212 and the sensing unit 222 are disposed on the circuit board 230. In another embodiment, the light source 212 and the sensing unit 222 can also be disposed on different circuit boards. Further, the main optical axis 213a of the reflected light beam 213' is, for example, substantially parallel to the optical axis 224b of the condensing unit 224.

In view of the optical path difference of the light rays of the light beam in the conventional technique being obvious, the present embodiment shifts the condensing unit 224 to let the optical axis 224b of the condensing unit 224 be deviated from the main optical axis 213a of the reflected light beam 213' so as to reduce the optical path difference of light rays of the reflected light beam 213'. Comparing to the conventional technique, the optical path difference of main light rays (i.e. light rays with high intensity) 213b, 213c of the reflected light beam 213' in FIG. 5 is smaller, so the imaging quality can be improved.

Figure 6:
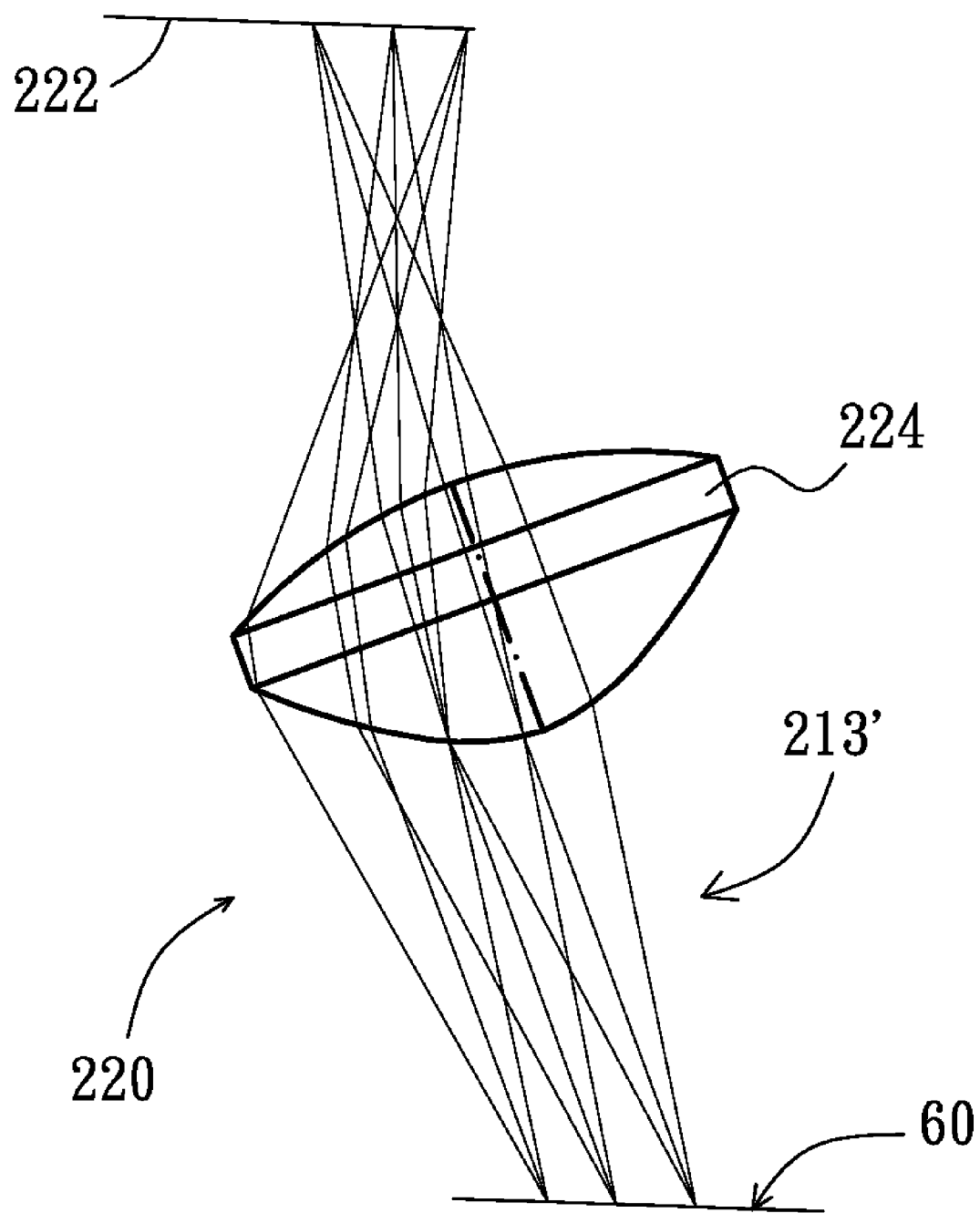
FIG. 6 is a simulate diagram showing transmission paths of light rays of the light beam in the sensing system of FIG. 4.

FIG. 6 shows simulated transmission paths, simulated by an optical simulation software, of light rays of the reflected light beam 213' in the sensing system 200 of FIG. 4. Referring to FIG. 6, after the optical axis 224b of the condensing unit 224 is shifted to deviate from the main optical axis 213a of the reflected light beam 213', the reflected light beam 213' can be exactly focused on the sensing unit 222 to eliminate a distortion. Such that, the imaging quality is improved.

In summary, in the image detecting apparatus of the present invention, the optical axis of the condensing unit is deviated from the main optical axis of the reflected light beam to reduce the optical path difference of the light rays of the reflected light beam, so the image detecting apparatus of the present invention has better imaging quality.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. An image detecting apparatus, comprising:
    an illumination system for providing a light beam to a working surface to generate a reflected light beam by the working surface;
    a sensing system, comprising:
        a sensing unit disposed on a transmission path of the reflected light beam reflected by the working surface for receiving the reflected light beam; and
        a condensing unit disposed between the sensing unit and the working surface, and for directly receiving the reflected light beam from the working surface, wherein an optical axis of the condensing unit is deviated from a main optical axis of the reflected light beam, and the optical axis of the condensing unit is parallel to the main optical axis of the reflected light beam.

2. The image detecting apparatus as claimed in claim 1, wherein the condensing unit comprises a lens.

3. The image detecting apparatus as claimed in claim 1, wherein the illumination system comprises a light source for providing the light beam.

4. The image detecting apparatus as claimed in claim 3, wherein the light source comprises a light emitting diode or a laser diode.

5. The image detecting apparatus as claimed in claim 3 further comprising a circuit board, wherein the light source and the sensing unit are disposed on the circuit board.

6. The image detecting apparatus as claimed in claim 1, wherein the sensing unit comprises a complementary metal-oxide-semiconductor image sensor or a charge coupled device.

7. The image detecting apparatus as claimed in claim 1 being an optical mouse or a fingerprint identifying apparatus.

* * * * *